US012684857B2

(12) United States Patent
Zhang

(10) Patent No.: US 12,684,857 B2
(45) Date of Patent: Jul. 14, 2026

(54) SEMICONDUCTOR STRUCTURE AND FABRICATION METHOD THEREOF

(71) Applicant: Semiconductor Manufacturing International (Shanghai) Corporation, Shanghai (CN)

(72) Inventor: Lijie Zhang, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 433 days.

(21) Appl. No.: 18/202,108

(22) Filed: May 25, 2023

(65) Prior Publication Data

US 2023/0386929 A1 Nov. 30, 2023

(30) Foreign Application Priority Data

May 31, 2022 (CN) .......................... 202210612181.8

(51) Int. Cl.
 *H10D 84/03* (2025.01)
 *H10D 62/10* (2025.01)
 *H10D 84/01* (2025.01)
 *H10D 84/83* (2025.01)

(52) U.S. Cl.
 CPC .......... *H10D 84/038* (2025.01); *H10D 62/115* (2025.01); *H10D 84/0135* (2025.01); *H10D 84/0151* (2025.01); *H10D 84/83* (2025.01)

(58) Field of Classification Search
 CPC .............. H10D 84/038; H10D 62/115; H10D 84/0135; H10D 84/0151; H10D 84/83; H10D 30/014; H10D 30/43; H10D 64/518; H10D 62/364; H10D 62/121; H10D 84/0188; H10D 84/85; B82Y 10/00
 USPC ....................................................... 257/401
 See application file for complete search history.

(56) References Cited

U.S. PATENT DOCUMENTS

2024/0128267 A1* 4/2024 Liang ................... H10D 84/038

* cited by examiner

*Primary Examiner* — Theresa T Doan
(74) *Attorney, Agent, or Firm* — Anova Law Group, PLLC

(57) ABSTRACT

A semiconductor structure includes a substrate, a first isolation layer in the substrate, composite layers over the substrate, and a second isolation layer between adjacent composite layers. Each composite layer includes channel layers, an insulating wall isolating two parts of each channel layer electrically, and a first gate electrode between adjacent channel layers. The second isolation layer penetrates into the first isolation layer.

20 Claims, 6 Drawing Sheets

SEMICONDUCTOR STRUCTURE AND FABRICATION METHOD THEREOF

CROSS-REFERENCE TO RELATED APPLICATION

This application claims the priority of Chinese Patent Application No. 202210612181.8, filed on May 31, 2022, the content of which is incorporated herein by reference in its entirety.

TECHNICAL FIELD

The present disclosure generally relates to the field of semiconductor technology and, more particularly, relates to a semiconductor structure and its fabrication method.

BACKGROUND

With the development of semiconductor technologies, the size of transistors has shrunk to a few nanometers. For example, fin field-effect transistors (FinFETs) have been shrunk to their dimensional limit. Whether it is the fin distance, short channel effect, or leakage and material limits, transistor manufacturing has become more and more difficult. It is even hard to design the physical structure of a FinFET, when the process node approaches the limits. Gate-all-around field-effect transistors (GAAFETs), including nanosheet transistors, are derived from the FinFET technology and represent a new direction in the industry. As the move to smaller process node continues, pitches between n-type FET (nFET) and p-type (pFET) devices in a standard cell keep decreasing, challenging the fabrication of GAAF-ETs and nanosheet transistors.

Forksheet FET devices (or Forksheet devices), which get the name from their complex bilateral fin structure, may represent the next effort after FinFETs and GAAFETs. The nFET and pFET of a Forksheet device have a small pitch, as they are integrated and separated by a dielectric wall in the structure. Compared with GAAFETs with the same process node, the circuit of Forksheet devices is more compact. It may improve scaling of standard cells of the static random-access memory (SRAM).

In SRAM circuits based on Forksheet devices, gate isolation between nFET and pFET devices (such as pull-down transistors and pull-up transistors) can be made by dielectric walls. For devices of the same conductivity type, such as between nFET and nFET devices (i.e., pull-down transistors and pull-down transistors), gate isolation is implemented by photolithography and etching techniques. However, when the feature size decreases further, it becomes harder to achieve gate isolation. Abnormalities, such as inaccurate alignment and incomplete gate removal at the gate cutting position, can happen with the existing photolithography and etching methods. It affects the device performance. Thus, there exists a need to improve the fabrication method of existing Forksheet devices.

The disclosed structures and methods are directed to at least partially alleviate one or more problems set forth above and to solve other problems in the art.

SUMMARY

One aspect of the present disclosure provides a semiconductor structure that includes a substrate, a first isolation layer in the substrate, multiple composite layers over the substrate, and a second isolation layer between adjacent composite layers. Each composite layer includes channel layers extending along a first direction parallel to the substrate and overlapping along a second direction perpendicular to the substrate, an insulating wall isolating two parts of each channel layer electrically, and a first gate electrode between adjacent channel layers. The second isolation layer penetrates into the first isolation layer.

Another aspect of the present disclosure provides a method for making a semiconductor structure. The method includes forming an initial composite material layer over a substrate, etching the initial composite material layer to form an isolation groove and intermediate composite material layers, forming an insulating wall in each intermediate composite material layer, and forming a first isolation layer at a bottom of the isolation groove. The initial composite material layer includes channel material layers and sacrificial material layers stacked alternately over each other. The isolation groove is between adjacent intermediate composite material layers. The first isolation layer penetrates into the substrate. The method further includes removing the sacrificial layers to form composite layers, and forming a second isolation layer in the isolation groove. Each composite layer includes channel layers overlapping along a direction perpendicular to the substrate. The insulating wall isolates two parts of each channel layer electrically.

Another aspect of the present disclosure provides a semiconductor structure that includes composite layers. Each composite layer includes channel layers, an insulating wall isolating two parts of each channel layer electrically, and a gate electrode between adjacent channel layers. The channel layers extend along a first direction and overlap each other along a second direction. The first and second directions are perpendicular to each other. The gate electrode surrounds a side of each channel layer in a plane perpendicular to the second direction.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Spatially relative terms, such as "on," "above," and "over" in the present disclosure, may be used to describe the relative positional relationship of space, not limited to direct contact or no direct contact. For example, the term "on" not only indicates "directly on" something but also includes the meaning of "on" something with an intermediate feature or a layer therebetween. The terms "above" or "over" not only indicates the meaning of "above" or "over" something but also means it is "above" or "over" something with no intermediate feature or layer therebetween (i.e., directly on something).

Figures 1, 2:
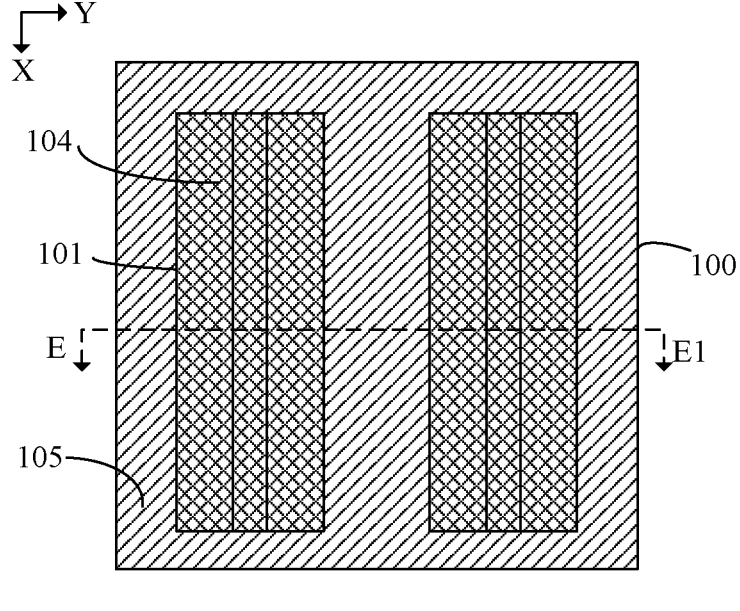
FIGS. 1 and 2 illustrate a top view and a cross-sectional view of a semiconductor structure at a stage of a fabrication process according to various embodiments of the present disclosure.

FIGS. 1 and 2 show a top view and a cross-sectional view of a semiconductor structure at a certain stage of a fabrication process according to the present disclosure. The top view is in an X-Y plane and the cross-sectional view is taken along a line EE1 in the X-Y plane. The semiconductor structure may be used to make Forksheet devices. The semiconductor structure includes a substrate and composite layers 101 over the substrate. The substrate is parallel to the X-Y plane and contains a base 100, protruding portions 200, and first isolation layers 105. The protruding portions 200 are in the substrate, on the base 100, and separated from each other by the first isolation layers 105. The first isolation layers 105, embedded in or penetrating into the substrate, are besides the protruding portions 200 and between adjacent protruding portions 200 in the Y direction. In some cases, the top surface of the first isolation layer 105 is flush with the top surface of the protruding portion 200. The protruding portions 200 are parallel to and extend along the X direction, respectively, and are arranged at positions along the Y direction. The X direction is perpendicular to the Y direction.

The composite layers 101 are formed over the protruding portions 200, respectively. Each composite layer 101 includes multiple channel layers 102 overlapping along a direction perpendicular to the substrate or the surface of the substrate. A first opening 103 is arranged between two adjacent channel layers 102. Each composite layer 101 also includes a second opening (not shown) that penetrates through the composite layer 101 along the X direction. The second opening also extends into the protruding portion 200 along a direction perpendicular to the substrate in some cases. As the second opening cuts each channel layer 102 into two parts, sides of the channel layers 102 are exposed on the sidewall of the second opening. Thereafter, an insulating wall 104 is formed in the second opening. The insulating wall 104 covers the exposed sides of the channel layers 102, and separates and isolates the two parts of each channel layer 102 electrically.

The method for forming the substrate and the composite layers 101 includes providing an initial substrate (not shown), and forming an initial composite material layer (not shown) over the initial substrate. The initial composite material layer includes a first composite material layer. The first composite material layer includes multiple channel material layers stacked over each other vertically and first sacrificial material layers each between two adjacent channel material layers. That is, the channel material layers and first sacrificial material layers are stacked alternately over each other. Further, the initial composite material layer is etched to form intermediate composite material layers (not shown). The initial substrate is etched to form the base 100 and the protruding portions 200. Trenches (not shown) are formed between adjacent protruding portions 200.

Further, the second opening (not shown) is formed in each of the intermediate composite material layers. The insulating walls 104 are made with dielectric materials in the second openings and the intermediate composite material layers are converted into transitional composite material layers (not shown). After forming the insulating walls 104, the first isolation layers 105 are made with dielectric materials at the bottom of the trenches. After making the first isolation layers 105, a dummy gate (not shown) is formed across the transitional composite material layers and the insulating walls 104. Further, an interlayer dielectric layer (not shown) is formed on the surface of the substrate. The interlayer dielectric layer is formed on the side of the dummy gate and exposes the top surface of the dummy gate. After forming the interlayer dielectric layer, the dummy gate is removed, and gate openings (not shown) are formed in the interlayer dielectric layer. After the first sacrificial material layers exposed by the gate openings are removed, the composite layers 101 are formed.

The method for forming the transitional composite material layers also includes depositing a mask layer (not shown) on the surface of the initial composite material layer. The mask layer is patterned to expose part of the surface of the initial composite material layer. The mask layer is used as a mask to etch the initial composite material layer, and form the intermediate composite material layers. Further, the intermediate composite material layers are used to make the transitional composite material layers with the second openings.

Optionally, the top surface of the insulating wall 104 is higher than the top surface of the channel layers 102. Part of the insulating wall 104 is above the uppermost channel layer 102 and overlaps with the channel layer 102 in a direction perpendicular to the surface of the substrate. In some other embodiments, the top surface of the insulating wall 104 is higher than the top surface of the channel layers 102, but except the uppermost channel layer 102.

In some cases, the initial composite material layer includes a second composite material layer on the first composite material layer. The second composite material layer includes a second sacrificial material layer and a third sacrificial material layer on the second sacrificial material layer. The first and second sacrificial material layers have different materials, and the second and third sacrificial material layers also have different materials.

The method of making the composite layers also includes forming an initial insulating wall (not shown) in the second opening, which may be performed after forming the second opening and before forming the dummy gate. After the initial insulating wall is formed, the second sacrificial material layer is removed to form first grooves in the transitional composite material layers (not shown). First insulating material layers (not shown) are formed in the first grooves. The insulating wall is formed by the first insulating material layer and the initial insulating wall. After the gate opening is made, the third sacrificial material layer exposed by the gate opening is removed.

As aforementioned, the first and second sacrificial material layers have different materials, and the second and third sacrificial material layers also have different materials. When the first grooves are etched, a process with a larger etching selectivity ratio for the second sacrificial material layer relative to the first and third sacrificial material layers may be selected. It may reduce the etching damage to the first and third sacrificial material layers, improve the flatness of the surfaces of the channel layers in the subsequent formation of the composite layers, and improve the performance of the device. Optionally, the first and third sacrificial material layers may have the same materials.

In some embodiments, part of the insulating wall 104 is between the first opening 103 and the substrate, i.e., below the lowest channel layer. In some other embodiments, the insulating wall does not contain a portion between the first opening 103 and the substrate.

Optionally, the initial composite material layer also includes a fourth sacrificial material layer (not shown) between the first composite material layer and the substrate. The fourth and first sacrificial material layers have different materials, and the fourth and third sacrificial material layers also have different materials.

Optionally, the method for forming the composite layers also includes removing the fourth sacrificial material layer after forming the initial insulating wall, and forming second grooves (not shown) in the transitional composite material layers. Second insulating material layers (not shown) are formed in the second grooves. The insulating wall 104 is formed by the second insulating material layer and the initial insulating wall. When the second grooves are etched, a process with a larger etching selectivity ratio for the fourth sacrificial material layer relative to the first and third sacrificial material layers may be selected. It may reduce the etching damage to the first and third sacrificial material layers, improve the flatness of the surfaces of the channel layers in the subsequent formation of the composite layers, and improve the performance of the device. Optionally, the second and fourth sacrificial material layers may have the same materials. In some cases, the second and fourth sacrificial material layers may be removed concurrently in the same process.

FIGS. 3-10 show cross-sectional views of the semiconductor structure shown in FIGS. 1 and 2 corresponding to certain stages of the fabrication process according the present disclosure. The viewing direction of FIGS. 3-10 is the same as that in FIG. 2.

Figure 3:
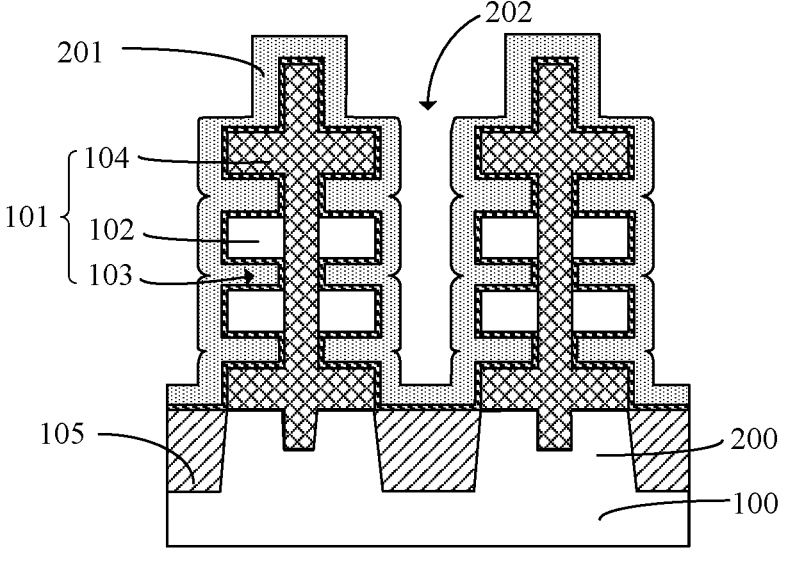
FIGS. 3-10 illustrate cross-sectional views of the semiconductor structure corresponding to certain stages of the fabrication process according to various embodiments of the present disclosure.

FIGS. 3-6 illustrate exemplary methods to make initial gates and isolation grooves. As shown in FIG. 3, a first gate material layer 201 is formed on the surfaces of the composite layers 101. The first gate material layer 201 is formed in the first opening 103 and between adjacent channel layers 102. The first gate material layer 201 surrounds the sides of the channel layers 102, i.e., surrounding the side of each channel layer 102 in a plane parallel to the substrate. The first gate material layer 201 also forms initial isolation grooves 202 between adjacent composite layers 101. The first gate material layer 201 includes a gate dielectric material layer (not shown), a work function material layer (not shown) on the gate dielectric material layer, and a first metal material layer on the work function material layer. The first metal material layer may includes a metal such as tungsten (W), copper (Cu), and/or gold (Au).

The first gate material layer 201 is used to form the initial gates, and the initial gates are used to make first gate electrodes. The first gate electrode includes a gate dielectric layer and a work function layer on the gate dielectric layer. The gate dielectric layer of the first gate electrode is made from the gate dielectric material layer. The work function layer of the first gate electrode is made from the work function material layer.

The first gate material layer 201 is deposited on the surface of the composite layers 101. The first gate material layer 201 also fills the gap between adjacent composite layers 101 partially, which forms the initial isolation groove 202. The initial isolation groove 202 is used to make an isolation groove and provide a space for making a self-aligned second isolation layer at a later stage.

Figure 4:
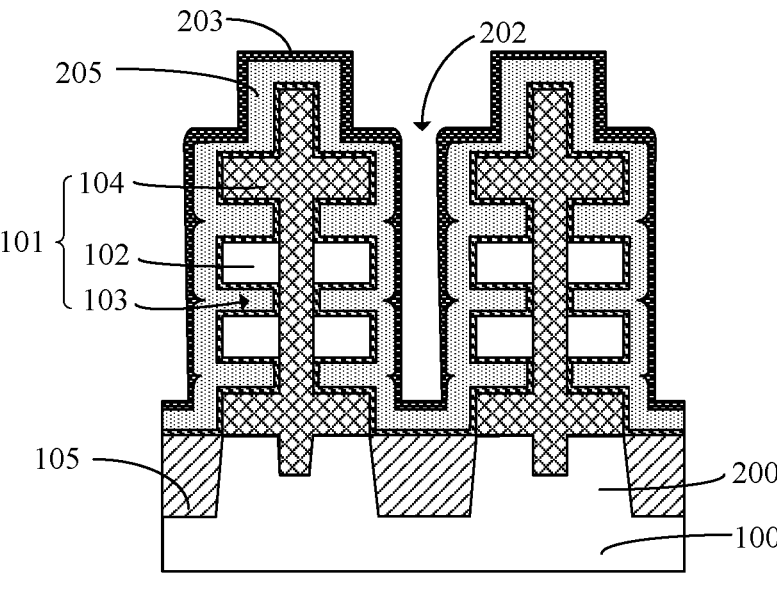

As shown in FIG. 4, an initial protective layer 203 is deposited on the surface of the first gate material layer 201. The material of the initial protective layer 203 may include a dielectric material such as one of silicon oxide, silicon nitride, silicon carbide, silicon oxycarbide, silicon oxynitride, aluminum oxide, aluminum nitride, silicon carbide nitride, and silicon oxycarbonitride or a combination thereof. The exemplary material of the initial protection layer 203 is silicon nitride in descriptions below.

Figures 5, 6:
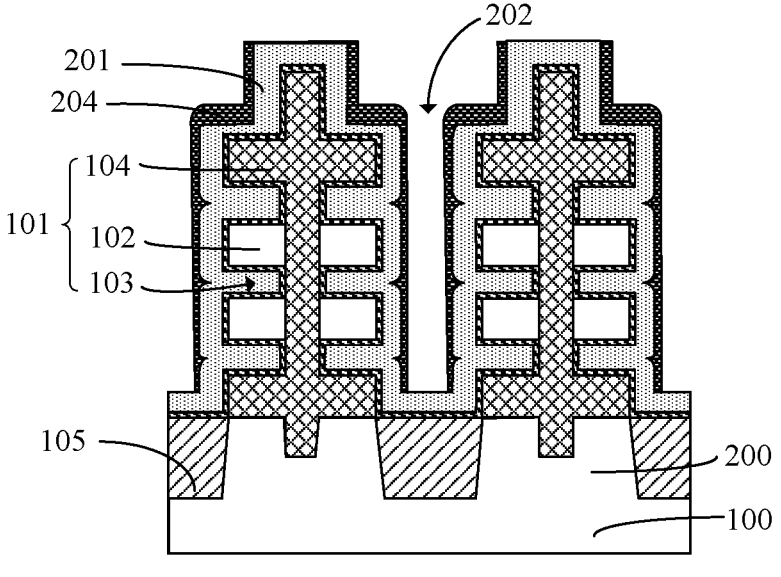

Referring to FIG. 5, the initial protective layer 203 is etched until the first gate material layer 201 at the bottom surface of the initial isolation groove 202 is exposed. The initial protective layer 203 is converted into a protective layer 204. The material of the protective layer 204 may include a dielectric material such as one of silicon oxide, silicon nitride, silicon carbide, silicon oxycarbide, silicon oxynitride, aluminum oxide, aluminum nitride, silicon carbide nitride, and silicon oxycarbonitride or a combination thereof. The exemplary material of the protection layer 204 is silicon nitride in descriptions below.

Referring to FIG. 6, with the protection layer 204 as a mask, the first gate material layer 201 is etched. The first gate material layer 201 at the bottom of the initial isolation groove 202 is etched until the surface of the substrate is exposed, creating the initial gates 205 and isolation grooves 206. The initial gates 205 are made using the first gate material layer 201, and the isolation grooves 206 are made from the initial isolation grooves 202. The initial gate 205 is between adjacent channel layers 102 and surrounds the sides of the channel layers 102, i.e., surrounding the sides of the channel layers 102 in planes parallel to the substrate.

In some cases, part of the first gate material layer 201 remains over the top surface of the composite layers 101 relative to the first gate material layer 201 at the bottom of the initial isolation groove 202. Optionally, the first gate material layer 201 over the top surface of the composite layers 101 may be etched to expose the insulating wall 104. In such cases, the top surface of the insulating wall may be higher than the channel layers, which may protect the channel layers and reduce the etching damage to the channel layers during etching processes.

The isolation grooves 206 are used to separate certain initial gates 205 to create electrical isolation. In some cases, in order to ensure a thorough cut at the bottom of the isolation groove 206, after the exposed first gate material layer 201 in the initial isolation groove 202 is etched away, the exposed surface of the substrate (i.e., the exposed surface of the first isolation layer 105) is further etched. Hence, isolation groove 206 may partially penetrate into the substrate (i.e., into the first isolation layer 105) along a direction perpendicular to the substrate. Optionally, the top part of the first isolation layer 105 is wider than the bottom part of the isolation groove 206 in the Y direction. In some other cases, the substrate is not etched when cutting the first gate material layer 201 in the initial isolation groove 202.

Figures 7, 8:
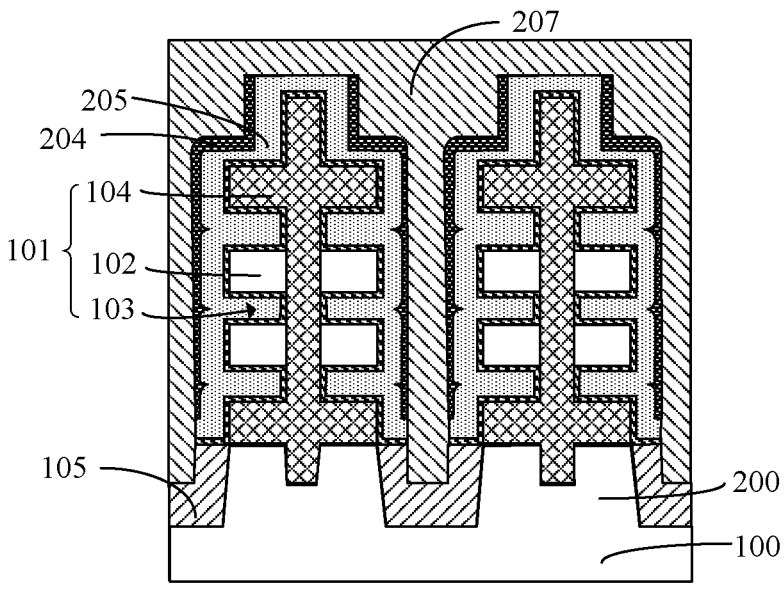

With reference to FIG. 7, a first isolation material layer 207 is formed over the initial gates 205 and in the isolation grooves 206. The material of the first isolation material layer 207 includes a dielectric material, e.g., one of silicon oxide, silicon nitride, silicon carbide, silicon oxycarbide, silicon oxynitride, aluminum oxide, aluminum nitride, silicon carbide nitride, and silicon oxycarbonitride or a combination thereof. The exemplary material of the first isolation material layer 207 is silicon oxide in descriptions below As shown in FIG. 8, third openings 208 are formed in the first isolation material layer 207. The third openings 208 expose the initial gates 205 over the top of the composite layers 101. The third opening 208 may be made by dry etch, wet etching, or a combination thereof. In some embodiments, a dry etch process is used to create the third opening 208, as it helps control the shape and appearance of the opening.

Optionally, the method for making the third opening 208 may include using a patterned layer 209 as a mask to etch the first isolation material layer 207. The patterned layer 209 is formed on the surface of the first isolation material layer 207, and exposes select parts of the first isolation material layer 207. With the patterned layer 209 as the mask, the first isolation material layer 207 is etched to form the third openings 208. Then, the patterned layer 209 is removed.

Figures 9, 10:
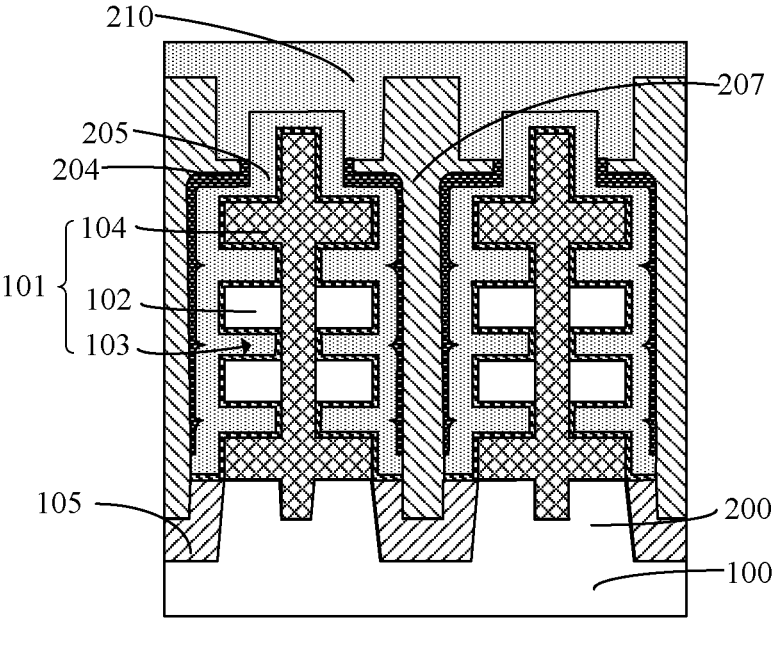

As shown in FIG. 9, a second gate material layer 210 is formed in the third openings 208 and over the surface of the first isolation material layer 207. The material of the second gate material layer 210 may include metals such as W, Cu, and/or Au.

Referring to FIG. 10, the first isolation material layers 207, the initial gates 205, and the second gate material layer 210 are planarized to expose the top surface of the insulating walls 104, creating first gate electrodes 212, second gate electrodes 211, and second isolation layers 213. The first gate electrodes 212 are made with the initial gates 205, the second gate electrodes 211 are made with the second gate material layer 210, and the second isolation layers 213 are formed from the first isolation material layers 207. The first electrode 212 is between adjacent channel layers 102 and surrounds the sides of the channel layers 102, i.e., surrounding and facing the sides of the channel layers 102 in planes parallel to the substrate. The second gate electrode 211 is beside and electrically contacts an adjacent first gate electrode 212. As the second isolation layer 213 is made in the isolation groove 206, the second isolation layer 213 penetrates into the first isolation layer 215 at least partially in a direction perpendicular to the substrate. Optionally, the top part of the first isolation layer 105 is wider than the bottom part of the second isolation groove 213 in the Y direction.

As such, the second isolation layer 213, isolating adjacent composite layers 101, may be formed by a self-alignment process. The first gate electrodes 212 may be made without involving additional photolithography and etching processes, and thus without being limited by photolithography and etching processes performed after the composite layers 101 are fabricated. Therefore, the quality of the second isolation layer 213 may be enhanced, and the device performance may be improved.

FIG. 10 also shows certain features of the semiconductor structure at a relatively late stage of the fabrication process according to the present disclosure. Made by the above-described methods, the semiconductor structure includes the substrate, the composite layers 101 over the substrate, the first gate electrodes 212, the second gate electrodes 211, and the second isolation layers 213. The substrate contains the base 100, the protruding portions 200 on the base 100, and the first isolation layers 105.

The protruding portions 200 are separated from each other. The first isolation layer 105 is between adjacent protruding portions 200, and the protruding portion 200 is between adjacent first isolation layers 105. The top surface of the first isolation layer 105 is flush with the top surface of the protruding portion 200. The protruding portions 200 are parallel to the X direction and arranged along the Y direction. The composite layers 101 are over the protruding portions 200, respectively.

The composite layer 101 contains multiple channel layers 102 that overlap along a direction perpendicular to the substrate. The first opening 103 is between two adjacent channel layers 102. The composite layer 101 also contains a second opening (not shown) that penetrates through the composite layer 101 along the X direction. The second opening also extends into the protruding portion 200 underneath. The sidewall of the second opening exposes the sides of the channel layers 102. The insulating wall 104 is formed in the second opening.

The first gate electrode 212 is formed on the surface of the composite layers 101, in the first opening 103, and between adjacent channel layers 102. The top part of the insulating wall 104 is exposed, and beside the first gate electrode 212 in a plane parallel to the substrate. The first gate electrode 212 is parallel to the Y direction. The isolation groove 206 is between adjacent first gate electrodes 212 and between adjacent composite layers 101. The bottom of the isolation groove 206 exposes the substrate. The second gate electrode 211 is formed between the sidewall of the upper part of the first gate electrode 212 and the second isolation layer 213. The top surface of the second gate electrode 211 is flush with the top surface of the first gate electrode 212. The second isolation layer 213 is formed in the isolation groove 206.

Optionally, the top surface of the insulating wall 104 is higher than the top surface of the channel layer 102. Part of the insulating wall 104 is arranged over the uppermost channel layer 102 and overlaps with the channel layer 102 in a direction perpendicular to the substrate. In some cases, part of the insulating wall 104 is configured between the first opening and the substrate.

Figure 11:
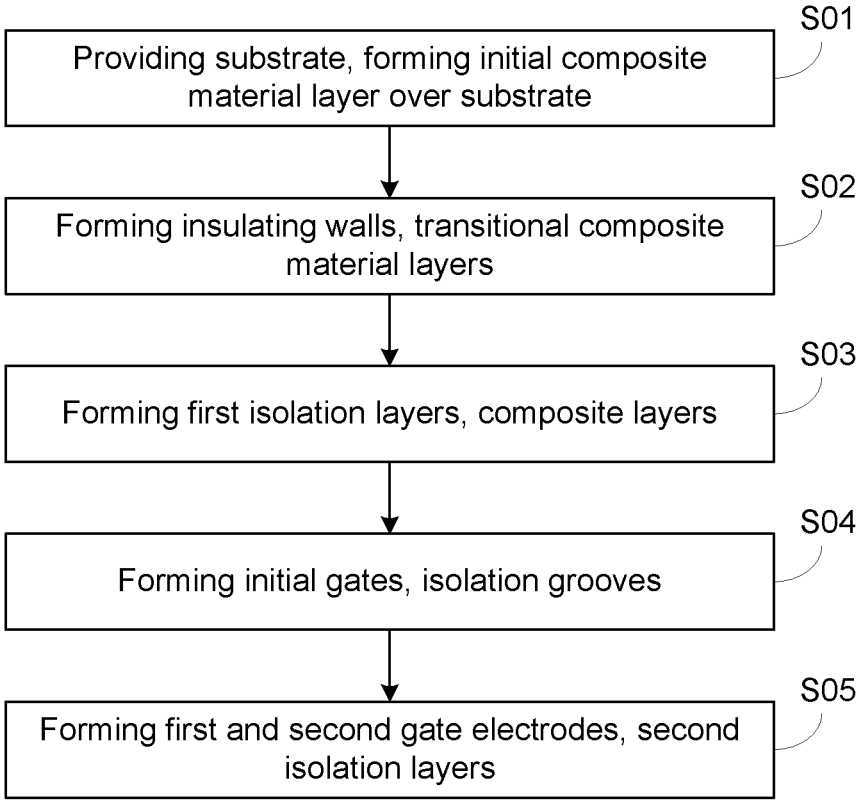
FIG. 11 illustrates an exemplary method for making a semiconductor structure according to various embodiments of the present disclosure.

FIG. 11 shows a schematic flow chart to illustrate methods of forming a semiconductor structure for Forksheet devices according to the present disclosure. At S01, a substrate is provided for making Forksheet devices. An initial composite material layer is deposited over the substrate. The initial composite material layer contains channel material layers and sacrificial material layers that are stacked alternately over one another.

At S02, trenches are etched that extend through the initial composite material layer to cut the initial composite material layer into multiple parts. The trenches extend partially into the substrate to create protruding portions of the substrate (e.g., the protruding portions 200 as shown in FIG. 2). The multiple parts of the initial composite material layer are over the protruding portions, respectively.

Further, openings are etched that extend through each part of the initial composite material layer to cut the part into two portions. The openings penetrate into the protruding portions partially. Thereafter, the openings are filled with dielectric materials to form insulating walls (e.g., the insulating walls 104 as shown in FIG. 2). The parts of the initial composite material layer are changed into transitional composite material layers. The insulating wall divides each transitional composite material layer into two units and isolates the two units electrically. Part of the insulating wall penetrates into the protruding portion. In some cases, the insulating wall in a transitional composite material layer includes a part that is above and overlaps the uppermost channel layer in a direction perpendicular to the substrate. Optionally, the insulating wall in a transitional composite material layer may also include a part that overlaps the lowest channel layer, is below the lowest channel layer, and between the lowest channel layer and the substrate.

At S03, the bottom parts of the trenches are filled with dielectric materials to form first isolation layers (e.g., the first isolation layers 105 as shown in FIG. 2). The first isolation layers are between adjacent protruding portions and become part of the substrate. The sacrificial material layers are removed by etch, creating channel layers and openings between adjacent channel layers. The transitional composite material layers are converted into composite layers (e.g., the composite layers 101 as shown in FIG. 2). The composite layers each are over one of the protruding portions, contain channel layers that overlap each other in a direction vertical to the substrate, contain openings between adjacent channel layers, and are separated from adjacent composite layers by the trenches.

At S04, electrically conductive materials (e.g., metallic materials) are deposited to grow a gate material layer (e.g., the first gate material layer 201 as shown in FIG. 3). Optionally, before depositing the gate material layer, a dielectric layer is deposited first. The gate material layer is isolated from the channel layers, fills the openings between the channel layers, and covers the sides of the channel layers. Further, an etch process is performed to cut through the gate material layer at the bottom of the trenches. The trenches become isolation grooves that penetrate into the first isolation layers after the etch process (e.g., the isolation groove 206 as shown in FIG. 6). The gate material layer is cut into multiple pieces by the isolation grooves, and each piece becomes an initial gate (e.g., the initial gate 205 as shown in FIG. 6).

At S05, the isolation grooves are filled with dielectric materials, and another electrically conductive layer is deposited. Further, a planarization process is conducted. First gate electrodes are made from the initial gates, while second gate electrodes are made from the other electrically conductive layer (e.g., the first and gate electrodes 212 and 211 as shown in FIG. 10). Some portions of the first gate electrode are between adjacent channel layers, while some other portions of the first gate electrode face and surround sides of the channel layers in planes parallel to the substrate. The second gate electrode is beside and electrically contacts an adjacent first gate electrode. The filled isolation grooves are second isolation layers that electrically isolate adjacent composite layers and adjacent first gate electrodes (e.g., the second isolation layers 213 as shown in FIG. 10). The bottom of the second isolation layer penetrates into the first isolation layer in the substrate.

Optionally in above descriptions, the layers may be formed or deposited by a deposition process, such as chemical vapor deposition (CVD) or atomic layer deposition (ALD). Additionally, the trenches, grooves, and openings may be filled by CVD and/or ALD.

Compared with the existing technologies, the above-illustrated embodiments of the present disclosure have the following advantages.

In the methods for forming a semiconductor structure provided by the present disclosure, the third opening is formed in the first isolation material layer. The third opening exposes the initial gate on top of the composite layers. The second gate material layer is formed in the third opening and on the surface of the first isolation material layer. The first isolation material layer, the initial gate, and the second gate material layer are planarized until the top surface of the insulating wall is exposed. The initial gate is used to form the first gate. The first isolation material layer is used to form the second isolation layer. The second gate material layer is used to form the second gate. The second isolation layer is formed by the self-alignment process. As such, the gate may be cut without being limited by the photolithography and etching processes. Therefore, the quality of the second isolation layer is improved, thereby improving the performance of the device.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A semiconductor structure, comprising:
   a substrate;
   a first isolation layer in the substrate;
   a plurality of composite layers over the substrate, each composite layer including a plurality of channel layers extending along a first direction parallel to the substrate and overlapping along a second direction perpendicular to the substrate, an insulating wall isolating two parts of each channel layer electrically, and a first gate electrode between adjacent channel layers; and
   a second isolation layer between adjacent composite layers, the second isolation layer penetrating into the first isolation layer,
   wherein the insulating wall includes a part that is above an uppermost channel layer and overlaps the uppermost channel layer in the second direction.

2. The structure according to claim 1, wherein the first gate electrode surrounds a side of one of the plurality of channel layers in a plane parallel to the substrate.

3. The structure according to claim 1, wherein:
   the first gate electrode further includes a portion formed on both sides of an upper portion of the insulating wall; and
   the structure further comprises a second gate electrode beside the portion of the first gate electrode and contacting the portion of the first gate electrode.

4. The structure according to claim 1, wherein the insulating wall penetrates through the substrate.

5. The structure according to claim 1, wherein the substrate includes a plurality of protruding portions, the first isolation layer being between two of the plurality of protruding portions.

6. The structure according to claim 1, wherein the insulating wall includes a part that is below a lowest channel layer and overlaps the lowest channel layer in the second direction.

7. A method for making a semiconductor structure, comprising:
   providing a substrate;
   forming a first isolation layer in the substrate;
   forming a plurality of composite layers over the substrate, each composite layer including a plurality of channel layers extending along a first direction parallel to the substrate and overlapping along a second direction perpendicular to the substrate, an insulating wall isolating two parts of each channel layer electrically, and a first gate electrode between adjacent channel layers; and
   forming a second isolation layer between adjacent composite layers, the second isolation layer penetrating into the first isolation layer,
   wherein the insulating wall includes a part that is above an uppermost channel layer and overlaps the uppermost channel layer in the second direction.

8. The method according to claim 7, further comprising:
   forming a part of the insulating wall that is above an uppermost channel layer and overlaps the uppermost channel layer.

9. The method according to claim 7, further comprising:
   forming a part of the insulating wall that is below a lowest channel layer and overlaps the lowest channel layer.

10. A semiconductor structure, comprising:
    a plurality of composite layers, each composite layer including a plurality of channel layers extending along a first direction and overlapping along a second direction, an insulating wall isolating two parts of each channel layer electrically, and a gate electrode between adjacent channel layers, wherein the first and second directions are perpendicular to each other, and the gate electrode surrounds a side of each channel layer in a plane perpendicular to the second direction, wherein the insulating wall includes a part that is below a lowest channel layer and overlaps the lowest channel layer in the second direction.

11. The structure according to claim 10, further comprising:

a substrate, the plurality of composite layers formed over the substrate;

a first isolation layer in the substrate; and a second isolation layer between adjacent composite layers, the second isolation layer penetrating into the first isolation layer.

12. The structure according to claim 11, wherein the insulating wall penetrates through the substrate.

13. The structure according to claim 10, wherein the insulating wall includes a part that is above an uppermost channel layer and overlaps the uppermost channel layer in the second direction.

14. The structure according to claim 1, wherein the part that is above the uppermost channel layer and overlaps the uppermost channel layer has a vertical sidewall coplanar with a corresponding vertical sidewall of the uppermost channel layer.

15. The structure according to claim 10, wherein the part that is below the lowest channel layer and overlaps the lowest channel layer has a vertical sidewall coplanar with a corresponding vertical sidewall of the lowest channel layer.

16. The structure according to claim 1, wherein the first gate electrode includes a metal material including tungsten (W), copper (Cu), and/or gold (Au).

17. The structure according to claim 1, further comprising a protective layer sandwiched between the first gate electrode and the second isolation layer.

18. The structure according to claim 17, wherein the protective layer includes a dielectric material including one of silicon oxide, silicon nitride, silicon carbide, silicon oxycarbide, silicon oxynitride, aluminum oxide, aluminum nitride, silicon carbide nitride, and silicon oxycarbonitride or a combination thereof.

19. The structure according to claim 3, wherein a topmost surface of the second gate electrode is flush with a topmost surface of the first gate electrode.

20. The structure according to claim 1, wherein the second isolation layer includes a part that is above an uppermost channel layer and overlaps the uppermost channel layer in the second direction.

* * * * *